(12) United States Patent
Sato

(10) Patent No.: US 7,029,598 B2
(45) Date of Patent: Apr. 18, 2006

(54) COMPOSITE MATERIAL FOR PIEZOELECTRIC TRANSDUCTION

(75) Inventor: Masao Sato, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 179 days.

(21) Appl. No.: 10/463,809

(22) Filed: Jun. 18, 2003

(65) Prior Publication Data
US 2004/0000661 A1  Jan. 1, 2004

(30) Foreign Application Priority Data
Jun. 19, 2002  (JP) .............................. 2002-179130

(51) Int. Cl.
  H01L 4/08  (2006.01)
  C04B 35/00 (2006.01)
  C09K 19/52 (2006.01)
(52) U.S. Cl. ............. 252/62.9 R; 310/311; 310/313 A; 310/320; 310/326; 252/299.01
(58) Field of Classification Search ........... 252/299.01, 252/299.1, 299.2, 299.3, 62.9 R; 310/311, 310/313 A, 320, 326
See application file for complete search history.

(56) References Cited

U.S. PATENT DOCUMENTS

| | | | |
|---|---|---|---|
| 4,595,515 A | 6/1986 | Wakino et al. ................. | 252/62 |
| 6,002,196 A * | 12/1999 | Sumita et al. ............... | 310/326 |
| 6,730,241 B1 * | 5/2004 | Obi et al. .............. | 252/299.01 |

FOREIGN PATENT DOCUMENTS

| | | | |
|---|---|---|---|
| GB | 2 188 585 | * | 10/1987 |
| JP | 01-304420 | * | 12/1989 |
| JP | 5-240298 | | 9/1993 |
| JP | 7-115230 | | 5/1995 |
| JP | 11-068190 | | 3/1999 |
| JP | 2000-086900 | | 3/2000 |
| JP | 2000-273435 | | 10/2000 |

OTHER PUBLICATIONS

English translation of the abstract and constitution of Yoshi et al.*
European Search Report dated Aug. 5, 2003.
Masao Kato, "The Outlook of Electro-Functional and Photo-Functional Polymers;" *Proceedings of the Institute of Electrostatics Japan*; vol. 10, 6; pp. 436-445; 1986.

(Continued)

*Primary Examiner*—Shean C. Wu
(74) *Attorney, Agent, or Firm*—Armstrong, Kratz, Quintos, Hanson & Brooks, LLP

(57) ABSTRACT

A composite material for piezoelectric transduction which exhibits a sufficient piezoelectricity, can be suitably utilized in various fields as a damping material and the like, and can be suitably utilized in the fields that require heat resistance. The composite material for piezoelectric transduction of the present invention absorbs external vibration or the like as strain energy, efficiently transforms the strain energy into electricity, and is capable of dissipating the electricity as heat, by using a material for piezoelectric transduction which is excellent in mass production at low cost and handlings. One of the preferable aspect of the composite material for piezoelectric transduction is to include a domain which exhibits piezoelectricity in a matrix material of the composite material for piezoelectric transduction, in which the domain is formed of a material for piezoelectric transduction which contains a main chain liquid crystal polymer.

22 Claims, 10 Drawing Sheets

OTHER PUBLICATIONS

J. I. Jim et al., "Thermotropic Liquid Crystalline Polyesters with Rigid or Flexible Spacer Groups," *The British Polymer Journal*, pp. 132-146, Dec. 1980.

Masao Sumita, "Sound Absorption and Insulation Structure Using a Piezoelectric Film," *Function & Materials*, vol. 15, No. 11, pp. 12-17, 1995 (CMC Publishing Co., Ltd.).

T. Watanabe et al., "Nematic Liquid Crystals with Polar Ordering Formed from Simple Aromatic Polyester," *Jpn. J. Appl. Phys.*, vol. 35 (1996), pp. L505-L507, Apr. 1996.

Sumita, M., 1995. Sound absorption and insulation struture using a piezoelectric film, *Functional Materials*, 15(11), 12-17 (1995), with English translation.

* cited by examiner

FIG. 2

| | NUMBER OF SEGMENT PER MOLECULE | POLARIZABILITY OF MOLECULES $b\ (\times 10^{30} \text{esu})$ | DIPOLE MOMENT $d^*$ (Debye) |
|---|---|---|---|
| → | 1 (monomer) | 3.2 | 1.9 |
| →→ | 2 (dimer) | 6.0 | 3.5 |
| →→→ | 3 (trimer) | 10.5 | 6.1 |
| →→→→ | 4 (tetramer) | 12.8 | 8.2 |
| | ⋮ | ⋮ | ⋮ |
| →→→ ⋯ → | x | | |

$$\text{H}_3\text{COC}\left[\text{O}-\phantom{}\hspace{-0.5em}\bigcirc\hspace{-0.5em}-\text{CO}\right]_n \text{OCH}_3$$

COMPOSITE MATERIAL FOR PIEZOELECTRIC TRANSDUCTION

BACKGROUND OF THE INVENTION

1. Field of the Invention

The present invention relates to a composite material for piezoelectric transduction, which can be utilized as a damping material in various fields.

2. Description of the Related Art

A damping material absorbs vibration, and there have been a number of the damping materials being developed. Of these, an attention has been recently paid on those which utilize piezoelectric transduction. The damping material which utilizes piezoelectric transduction generally comprises a piezoelectric element and a matrix portion. A process that the damping material absorbs vibration is as follows: the matrix portion receives vibrational energy as strain, the piezoelectric element receives the strain in the matrix portion as strain and transduce the strain into electricity. Thereafter, the piezoelectric element dissipates the strain out of the damping material as Joule heat. As a result, the vibrational energy applied to the damping material is absorbed in the damping material, is transformed into heat, and then is dissipated from the damping material.

Damping materials that utilize the piezoelectric transduction include the following three.

The first damping material refers to an organic-inorganic composite damping material. As disclosed in Japanese Patent Application Laid-Open (JP-A) No. 05-31845, JP-A No. 05-240298, JP-A No. 06-126909, or the like, in the organic-inorganic composite material, a material for piezoelectric transduction of an inorganic material such as barium titanate or the like, is dispersed in matrix material of an organic material such as rubber or the like.

The second damping material refers to an organic piezoelectric film damping material. As described in Masao Sumida (1995) *Sound absorption and insulation structure using a piezoelectric film.*, vol. 15, no. 11., or the like, it refers to a film itself that exhibits piezoelectricity such as polyvinylidene fluoride, or the like.

The third damping material refers to an organic-organic damping material. As disclosed in JP-A No. 2000-86900, JP-A No. 2000-273435, or the like, a material for piezoelectric transduction of small organic molecules such as phenolic substances or the like, is dispersed in matrix material of an organic material such as rubber or the like.

The above-mentioned damping materials have problems as follows. In a case of the organic-inorganic composite damping material, it is difficult to obtain a single crystal of an inorganic material such as the barium titanate, or the like. In addition, there is an excessively large difference in elasticmoduli of the inorganic material and the matrix material. Therefore, vibrational transmittance from the matrix material to the inorganic material is insufficient. The organic-inorganic composite damping material is hence easy to become fractured by strain.

In a case of the organic piezoelectric film damping material, its piezoelectricity deteriorates over time. Moreover, the organic piezoelectric film damping material negatively influences on environment when discarded. As disclosed in JP-A No. 11-68190, in an ordinary door size of 200 cm×100 cm, an optimum resistance in an electric circuit for effective damping properties is 0.25Ω, which is small and impractical. In a case of the organic-organic composite damping material, small organic molecules of the phenolic substance or the like are oriented insufficiently. It therefore has insufficient piezoelectric properties. The function of the organic-organic composite damping material is not necessarily sufficient. In addition, PVDF, which has been widely used as one of the organic materials for its good piezoelectric properties, also has a disadvantage in that its piezoelectric performance can easily be deteriorated by heat because of its low glass transition temperature (Tg). The PVDF, therefore, is not suitable for a usage that requires heat resistance since it cannot maintain its initial performance for a long period of time. In addition, it is difficult to increase the thickness of a film made of a ferroelectric liquid crystal, and piezoelectricity of substances like cellulose are not based on polarity and therefore such substances have the defect in that their piezoelectricities are inherently small.

Accordingly, there has not yet been provided a composite material for piezoelectric transduction which does not cause the above-mentioned problems, absorbs external vibration as strain energy, then efficiently transforms the strain energy into electricity, is capable of dissipating the electricity as heat, can maintain sufficient piezoelectricity even if being kept at high temperature for a long period, and is suitable for a usage that requires heat resistance.

SUMMARY OF THE INVENTION

It is therefore an object of the present invention to provide a composite material for piezoelectric transduction which exhibits a sufficient piezoelectricity, can be suitably utilized in various fields as a damping material and the like, and can be suitably utilized in the fields that require heat resistance. The composite material for piezoelectric transduction of the present invention absorbs external vibration or the like as strain energy, efficiently transforms the strain energy into electricity, and is capable of dissipating the electricity as heat, by using a material for piezoelectric transduction which is excellent in mass production at low cost and handlings.

The composite material for piezoelectric transduction of the present invention comprises a domain which exhibits piezoelectricity in a matrix material of the composite material for piezoelectric transduction. In the composite material for piezoelectric transduction of the present invention, the domain is formed of a material for piezoelectric transduction which contains a main chain liquid crystal polymer. The matrix material in the composite material for piezoelectric transduction receives external vibrational energy as strain. The strain of the matrix material is received as strain by the material for piezoelectric transduction which is a component of a domain that exhibits piezoelectricity, is transformed into electricity, and is then dissipated as Joule heat.

BRIEF DESCRIPTION OF THE DRAWINGS

FIG. 2 is a schematic view showing another example that a polarizability of the material for piezoelectric transduction increases in accordance with polymerization degree of monomer unit in the material for piezoelectric transduction.

Figure 1:
FIG. 1 is a schematic view showing an example that a polarizability of the material for piezoelectric transduction increases in accordance with polymerization degree of monomer unit in the material for piezoelectric transduction.

DESCRIPTION OF THE PREFERRED EMBODIMENTS (Composite Material for Piezoelectric Transduction)

The composite material for piezoelectric transduction of the present invention comprises a domain that exhibits piezoelectricity in a matrix material. The composite material for piezoelectric transduction of the present invention may further comprise other materials, if necessary.

Domain that Exhibits Piezoelectricity

The domain that exhibits piezoelectricity is required to be formed of a material for piezoelectric transduction.

The material for piezoelectric transduction comprises a main chain liquid crystal polymer. The material for piezoelectric transduction may further comprise other components suitably selected according to purposes.

The main chain liquid crystal polymer is not limited, and can be suitably selected according to purposes, as long as it shows SHG activity. Examples of the main chain liquid crystal polymer may or may not comprise a constitutional unit having a cyclic group, as a repeated unit. Specific examples of the main chain liquid crystal include those which have a constitutional unit having a cyclic group, a connected portion, a functional group, and a spacer portion, as a repeated unit; and the like.

These can be either used alone or in combination of two or more. Of these, a polyester is preferable, an aromatic polymer is more preferable, and an aromatic polyester is particularly preferable.

The aromatic polyester is not particularly limited, and can be selected in accordance with the object. Examples of the aromatic polyester include the aromatic polyesters which have at least one selected from aromatic diol, aromatic dicarboxylic acid, and hydroxycarboxylic acid, shown in Table 1, as a monomer unit.

TABLE 1

| Aromatic diol | Aromatic dicarboxylic acid | Hydroxycarboxylic acid |
|---|---|---|
| HO—⬡—OH | HOOC—⬡—COOH | HO—⬡—COOH |
| X-substituted HO—⬡—OH (Y) | HOOC—⬡(X)—COOH | HO—naphthalene—COOH |
| (X, Y = halogen, alkyl group) | (X = halogen, alkyl group) | |
| HO—naphthalene—OH | HOOC—⬡—⬡—COOH | HO—⬡(X)—COOH |
| HO—⬡—⬡—OH | HOOC—naphthalene—COOH | (X + halogen, alkyl group) HO—⬡—CH=CHCOOH |

TABLE 1-continued

| Aromatic diol | Aromatic dicarboxylic acid | Hydroxycarboxylic acid |
|---|---|---|
| 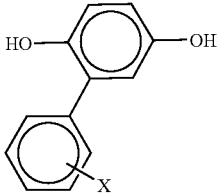<br>(X = H, halogen, alkyl group) | 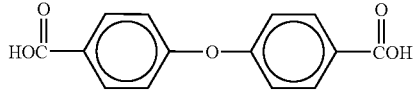 |  |
| 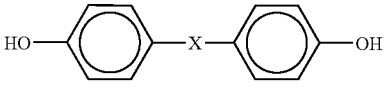<br>(X = CH$_2$, C(CH$_3$)$_2$, SO$_2$) | 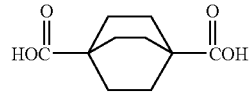 | |
| 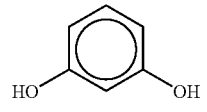 | 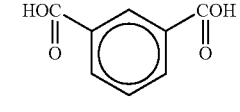 | |
| 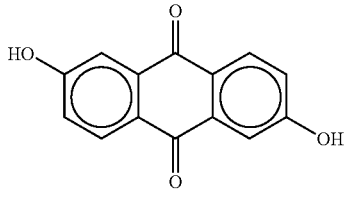 | 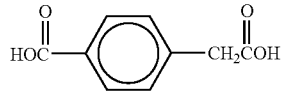 | |
| | 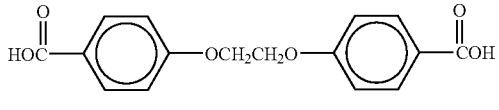 | |
| | 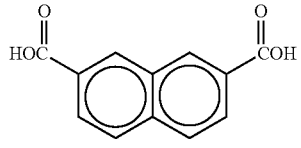 | |

A preferable example of the aromatic polymer includes a structure expressed by the following Formula (1):

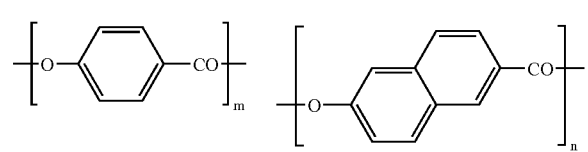

Formula (1)

("m" and "n" each express the degree of polymerization.)

In the above Formula (1), a ratio (m:n) of "m" and "n" is not particularly limited, and can be suitably selected according to purposes. The ratio is preferably 90:10 to 50:50, and more preferably 80:20 to 60:40.

Examples of the aromatic polymer, other than the one having a structure expressed by the Formula (1), include those having a structure expressed by the following Formulae (2) to (20), and the like.

Formula (2)
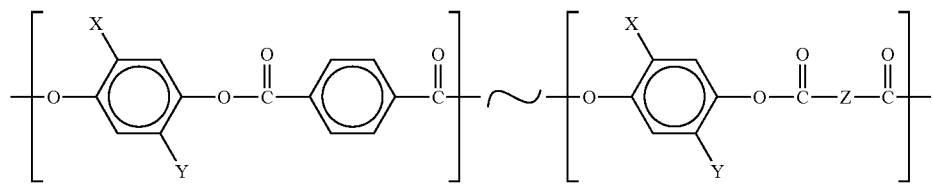
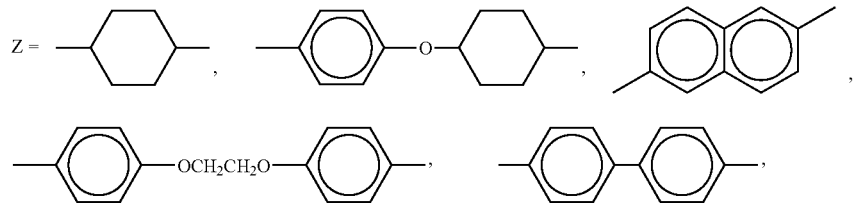
Formula (3)
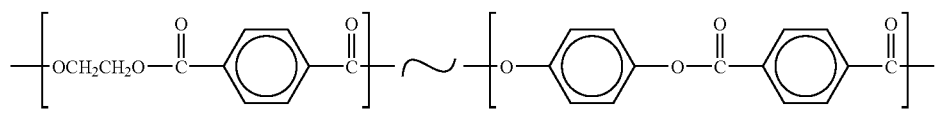
(Formula 4)
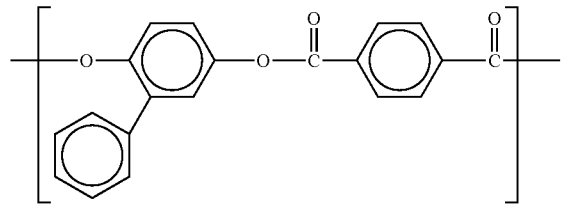
(Formula 5)
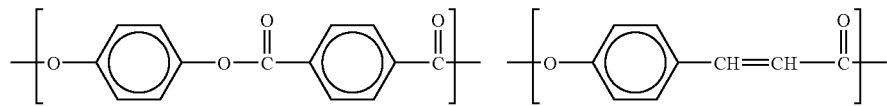
(Formula 6)
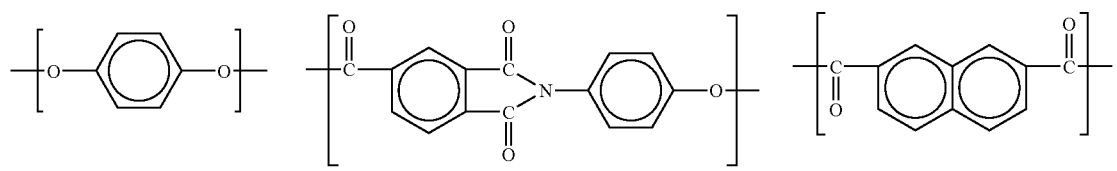
(Formula 7)
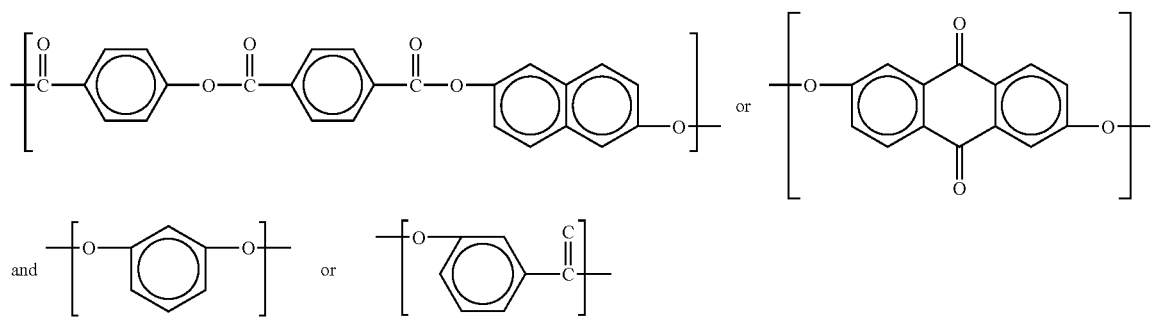
(Formula 8)
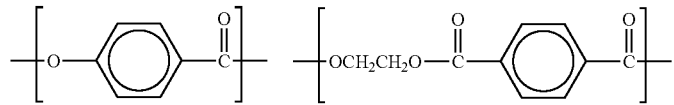

-continued
(Formula 9)
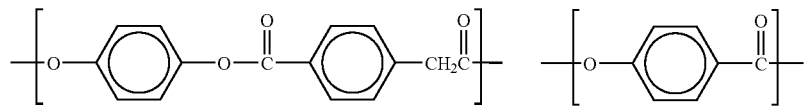
(Formula 10)
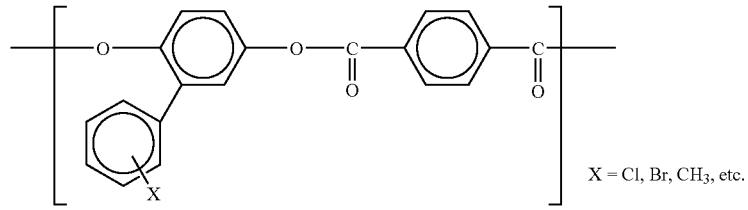
X = Cl, Br, CH₃, etc.
(Formula 11)
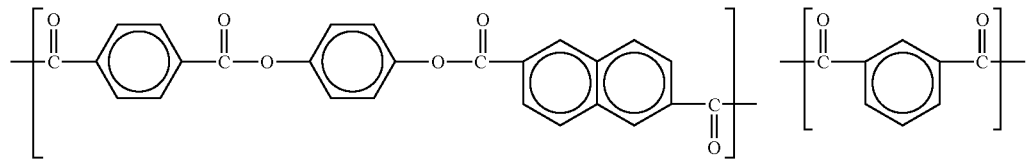
(Formula 12)
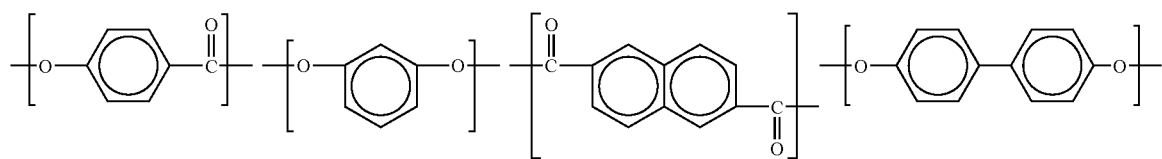
(Formula 13)
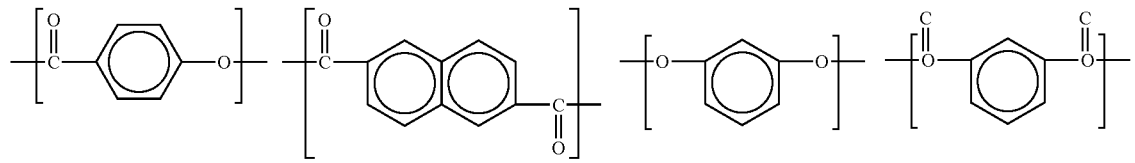
(Formula 14)
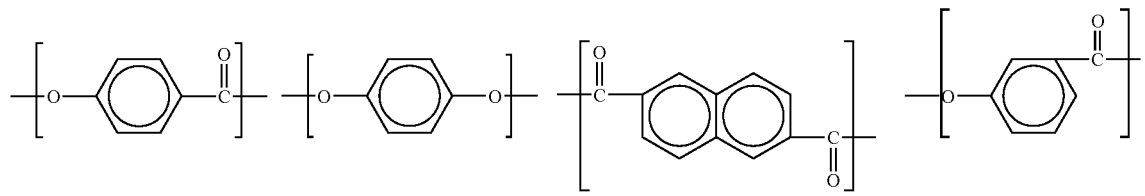
(Formula 15)
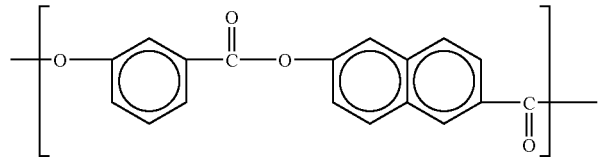
Formula (16)
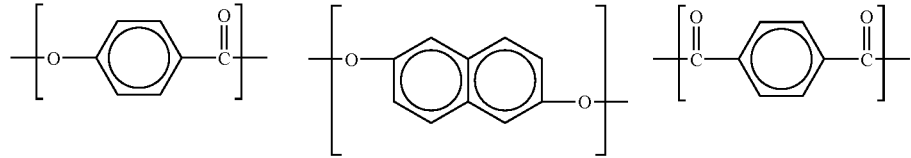
Formula (17)
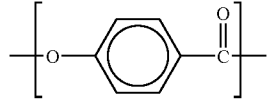

Formula (18)

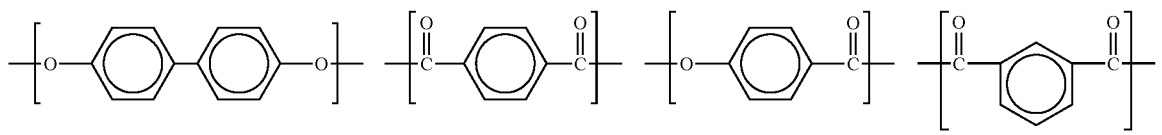

Formula (19)

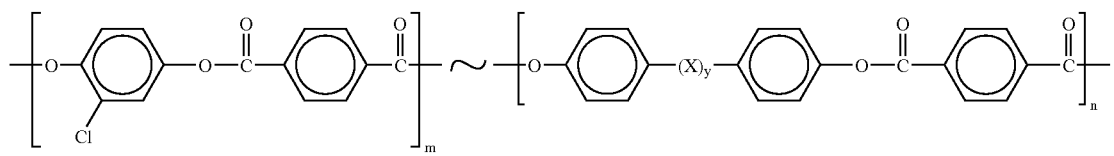

("m" and "n" each express the degree of polymerization, and "X" expresses —C(CH$_3$)$_2$—, —CH$_2$—, —O—, —S—, or —SO$_2$—; "y" expresses an integer of 0 or 1)

Formula (20)

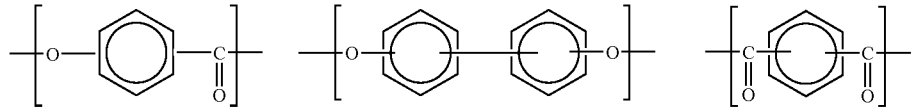

There is no particular limitations on a process for synthesizing the main chain liquid crystal polymer, and can be suitably selected according to purposes. Examples include various processes for synthesizing as shown in the following schemes, and the like. Note that, in general, the main chain liquid crystal polymer which has different degree of condensation, can be synthesized by appropriately selecting the reaction temperature and the reaction time, even if a molar ratio of the monomer is stable.

Formula (21)

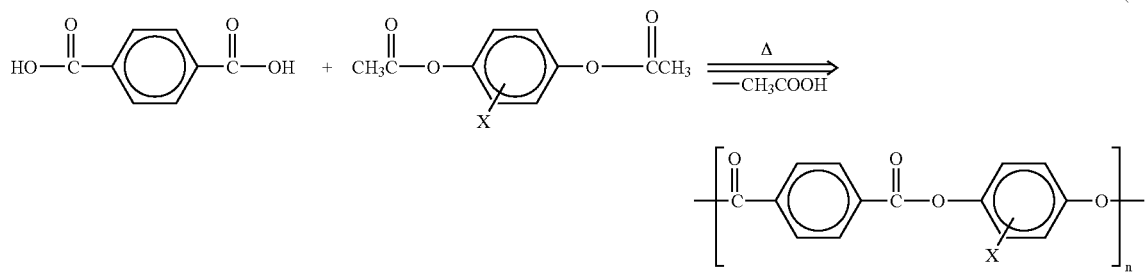

("n" expresses an integer, and "x" expresses hydrogen atom, halogen atom, or a hydrocarbon group)

Formula (22)

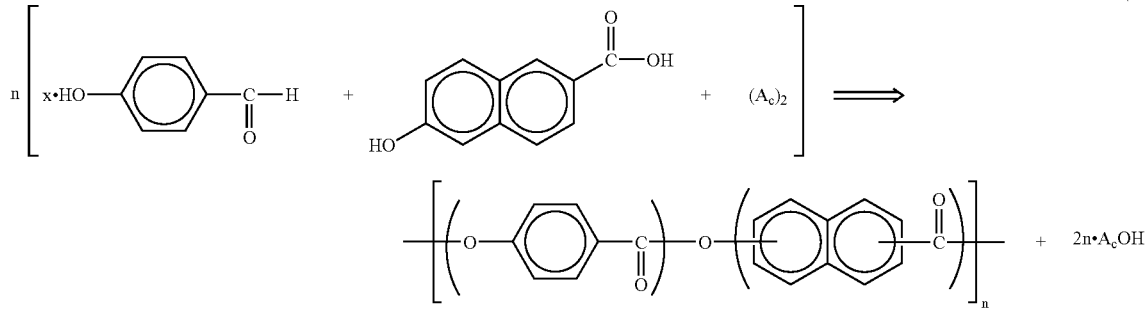

("Ac" expresses an acetyl group, "x" and "n" each express an integer)

Formula (23)

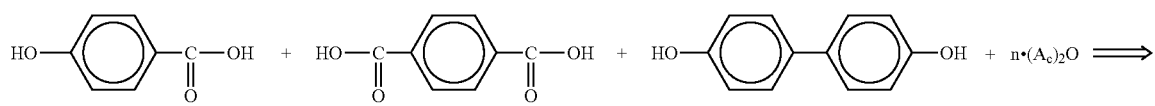

-continued

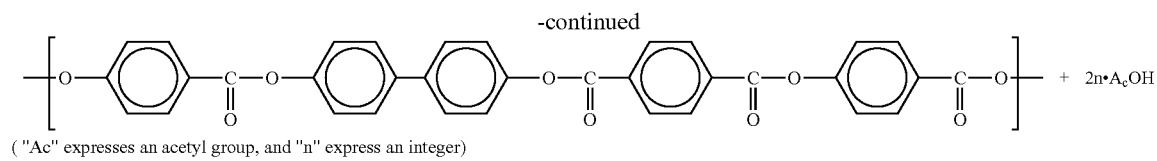

("Ac" expresses an acetyl group, and "n" express an integer)

Formula (24)

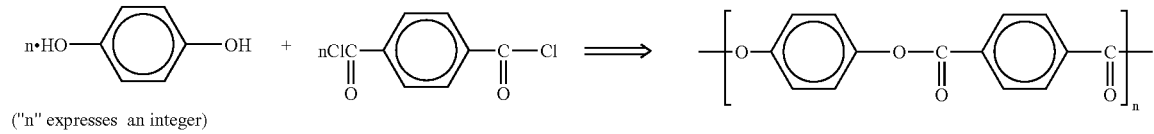

("n" expresses an integer)

Formula (25)

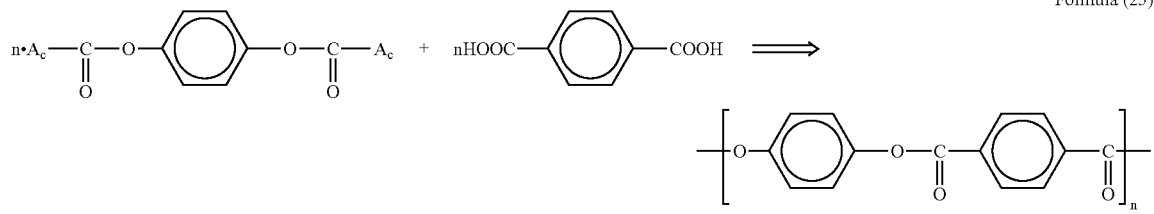

("Ac" expresses an acetyl group, and "n" expresses an integer)

The main chain liquid crystal polymer can be suitably synthesized, or can be a commercial product.

Examples of the commercial product include "Zenite (registered Trademark)" available from Du Pont Kabushiki Kaisha, "Sumika super (registered Trademark)" available from Sumitomo Chemical Co., Ltd., "Vectran (registered Trademark)" available from Kuraray Co., Ltd., "Octa (registered Trademark)" available from DAINIPPON INK AND CHEMICALS INCORPORATED, "Vectra (registered Trademark)" available from Polyplastics Co., Ltd., "Rodrun" available from Unitika Ltd., "Xydar (registered Trademark)" available from Nippon Sekiyu Kagaku Kogyo SHG (Second Harmonic Generation) activity, and preferably has a maximum polarizability in a direction substantially parallel to a main chain thereof.

The reason that the main chain liquid crystal polymer shows SHG (Second Harmonic Generation) activity is assumingly as follows. Referring into FIGS. 1 and 2 (T. Watanabe et al. *Jpn. J. Appl. Phys.* (1996) vol. 35 L 505), the polarizability increases in accordance with polymerization degree of a monomer unit of the main chain liquid crystal polymer. When a molecular weight of the main chain liquid crystal polymer increases and a dipole moment, "d*," exceeds a certain point, the main chain liquid crystal polymer has a phase structure which has no symmetry.

Other Component(s)

There are particularly no limitations on other component(s) for the material for piezoelectric transduction, and can be suitably selected according to purposes. Examples of the other component(s) include a polymer for adhesion which enables easier film-forming, and the like. Examples of the polymer for adhesion include known binder resins, and the like.

The known binder resins are not particularly limited, and can be selected according to the object. Examples of the known binder resins include a thermoplastic resin, rubber (elastomer rubber), an adhesive, monomer and oligomer, polymer alloy, polyimide, a natural product, an inorganic product, and the like.

Examples of the thermoplastic resin include poly vinylacetate (PVAc), poly vinylalcohol (PVA), poly vinylbutylal (PVB), acrylic copolymer (acryl), polyethylene (PE), ethylene-vinyl acetate copolymer (EVA), vinyl chloride plus-sol, poly vinyl chloride-vinyl acetate copolymer, poly vinyl pyrrolidine, nylon 11,12 copolymerized nylon, copolymer of polyethylene terephthalate, poly butylene terephthalate, a urea resin, a melamine resin, a phenolic resin, a resorcinol resin, an epoxy resin, polyurethane, vinylurethane, and the like.

Examples of the rubber include polyisoprene natural rubber, synthetic polyisoprene rubber, polychloroprene, acrylonitrile-butadiene copolymer, styrene-butadiene copolymer, styrene-butadiene-vinyl pyridine terpolymer, poly isobutylene, butyl rubber, poly sulfide, room temperature vulcanizing silicone rubber, chlorinated rubber, brominated rubber, graft polychloroprene, styrene-isoprene-styrene, styrene-butadiene-styrene, and the like.

Examples of the adhesive include a pressure sensitive adhesive, an acrylic adhesive, a silicone adhesive, and the like.

Examples of the monomer and oligomer include cyanoacrylate, an ultraviolet hardening adhesive, a visible light hardening adhesive, an electron beam hardening adhesive, and the like.

Examples of the polymer alloy include poly vinylformal/phenolic, poly vinylbutyral/phenolic, nitrile rubber/phenolic, nitrile rubber/epoxy, liquid nitrile rubber/epoxy, epoxy/phenolic, and the like.

Examples of the natural product include starch, dextrin, and the like.

Examples of the inorganic products include sodium silicate, ceramics, and the like.

There are no particular limitations on a content of the other component(s) in the material for piezoelectric transduction, and can be suitably adjusted as long as it does not negatively influence the effect of the present invention.

The domain which exhibits piezoelectricity is preferably formed of splits that can be obtained by cutting a mold of the material for piezoelectric transduction.

There is no particular limitation on a formation of the splits, and can be suitably selected according to purposes, as long as they exhibit piezoelectricity. The formation can be suitably selected at least one of a thread split, a film split, and a granular split.

There is no particular limitation on size, area, diameter, length, thickness, the number, or the like, of the splits, and can be suitably selected according to purposes. When the splits are the thread splits, each of the thread splits may have substantially the same diameter, length and may be formed of substantially the same material. Alternatively, at least one of the diameter, the length, and the material may be different for each of the thread splits. If each of the thread splits has substantially the same diameter, length and may be formed of substantially the same material, there is little difference in resonance frequency properties of piezoelectric tranduction properties for each of the thread splits. Therefore, the composite material for piezoelectric transduction using the thread splits with substantially the same diameter and the like, is suitable when receiving external vibrational energy in a specific frequency range. If at least one of the diameter, the length, and the material is different for each of the thread splits, there is difference in piezoelectric transduction properties among the thread splits. Therefore, the composite material for piezoelectric transduction using the thread splits with different diameters or the like, is suitable when receiving external vibrational energy in various frequency ranges.

When the splits are the film splits, each of the film splits may have substantially the same area, thickness and may be formed of substantially the same material. At least one of the area, the thickness, and the material may be different for each of the film splits. If each of the film splits has substantially the same area, thickness and may be formed of substantially the same material, there is little difference in resonance frequency properties of piezoelectric tranduction properties for each of the film splits. Therefore, the composite material for piezoelectric transduction using the film splits with substantially the same area and the like, is suitable when receiving external vibrational energy in a specific frequency range. If at least one of the area, the thickness, and the material is different for each of the film splits, there is difference in piezoelectric transduction properties among the film splits. Therefore, the composite material for piezoelectric transduction using the film splits with different area or the like, is suitable when receiving external vibrational energy in various frequency ranges.

Figure 3:
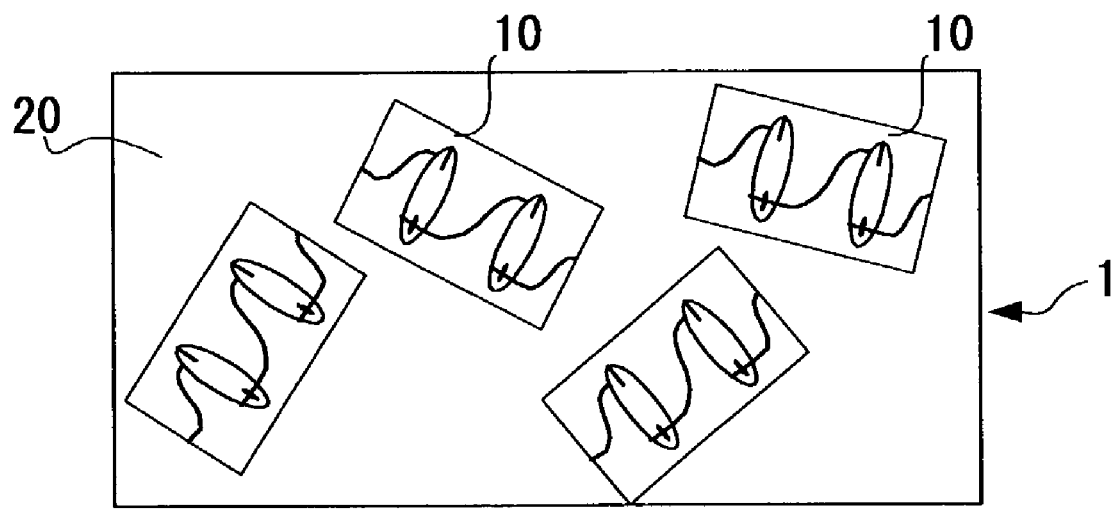
FIG. 3 is a schematic diagram showing an example of a preferable aspect of a composite material for piezoelectric transduction according to the present invention.
Figure 4:
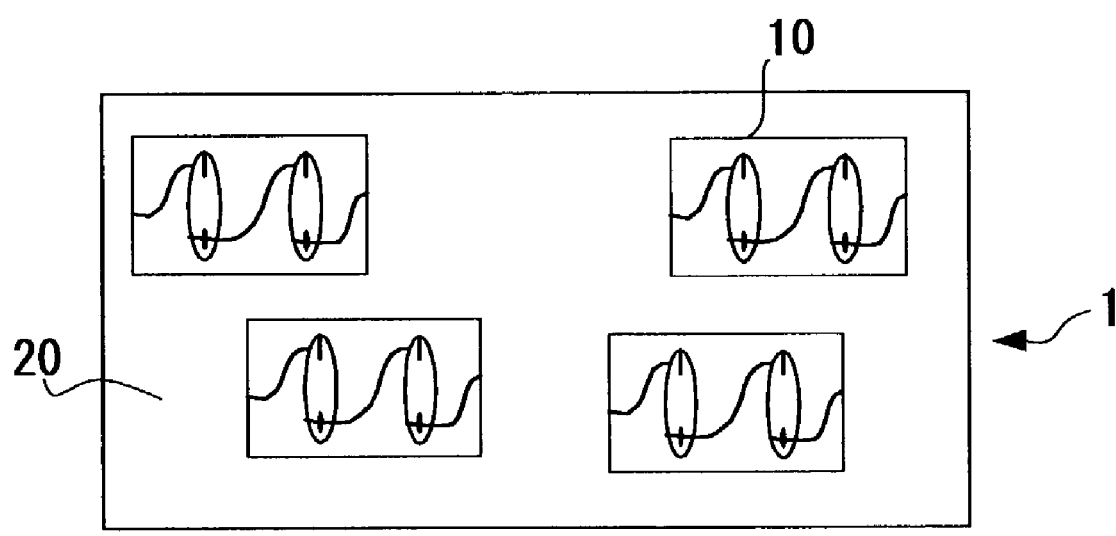
FIG. 4 is a schematic diagram showing an example of another preferable aspect of a composite material for piezoelectric transduction according to the present invention.
Figure 5:
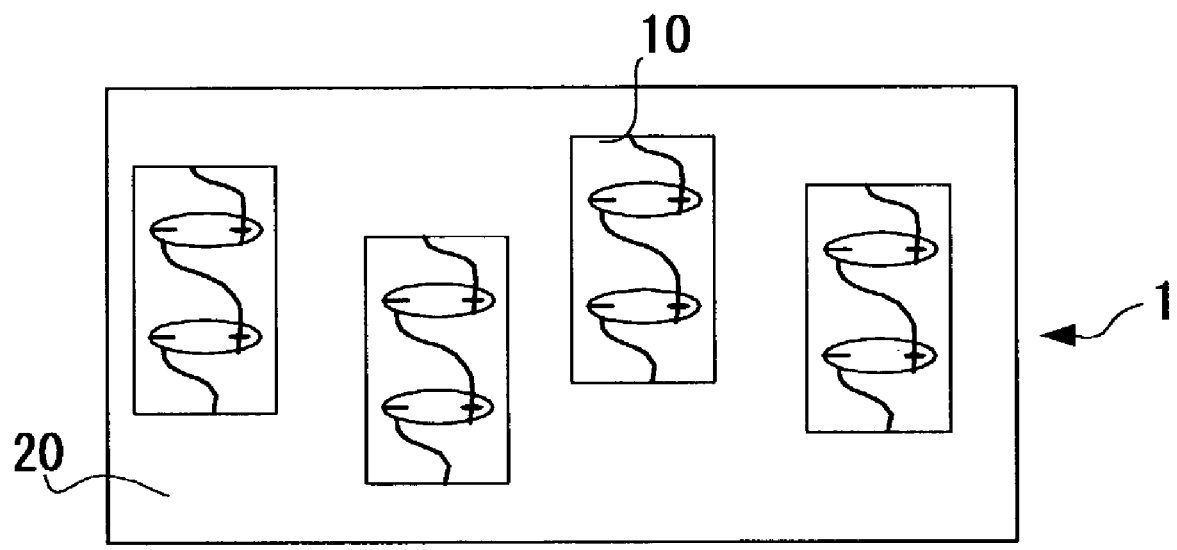
FIG. 5 is a schematic diagram showing an example of another preferable aspect of a composite material for piezoelectric transduction according to the present invention.

As shown in FIG. 3, the splits 10 may be present in a matrix material 20 in such a way that the directions of dielectric polarization of the splits 10 are random (a vector of dielectric polarization of a split is randomly oriented from that of another split), or, as shown in FIGS. 4 and 5, in such a way that the directions of dielectric polarization of the splits 10 are substantially the same (a vector of dielectric polarization of a split is substantially equally oriented to that of another split). When the directions of dielectric polarization are random, it is preferable from a viewpoint that external vibrational energy from any direction can be efficiently transduced into piezoelectricity (without directionality). When the directions of dielectric polarization are oriented in one direction, it is preferable from a viewpoint that external vibrational energy from a specific direction can be efficiently transduced into piezoelectricity (with directionality).

There is no particular limitation on elastic modulus of the splits, and can be suitably selected according to purposes. The elastic modulus of the splits is preferably substantially the same as that of the matrix material. In a case of having the same elastic modulus between the splits and the matrix material, strain of the matrix material is efficiently transmitted to the splits, and the composite material for piezoelectric transduction is hence excellent in piezoelectric transducing properties.

The composite material for piezoelectric transduction preferably has a decay rate of 0.1 or less, more preferably 0.05 or less, and particularly preferably 0. Here, the decay rate is defined as $$((\text{piezoelectricity}\alpha - \text{piezoelectricity}\beta)/\text{piezoelectricity}\alpha),$$

wherein $\alpha$ is the piezoelectricity of the domain at room temperature prior to heating and $\beta$ is the piezoelectricity of the domain at room temperature after seven days of continuous heating at 85° C.

A method of measuring the piezoelectricity is not specifically limited, and can be measured using a method which is selected appropriately in accordance with the object. For example, one can use a piezoelectricity measurement device, e.g., a d33 meter, to readily measure the piezoelectricity.

A composite material for piezoelectric transduction having a decay rate of 0.1 or less is advantageous from the standpoint that the composite material maintains sufficient piezoelectricity even though being left at high temperature for a long period and can suitably be used in a usage that requires heat resistance.

There is no particular limitation on a content of the splits in the composite material for piezoelectric transduction, and can be suitably selected according to purposes. The content is preferably 5% by mass or more. If the content is less than 5% by mass, the composite material for piezoelectric transduction may exhibit insufficient piezoelectric transducing properties.

Matrix Material

There is no particular limitation on the matrix material, and can be suitably selected according to purposes. Examples of the matrix material include resins, rubber, thermoplastic elastomer, and the like.

There is no particular limitation on the resins, and can be suitably selected according to purposes. Examples of the resins include a thermoplastic resin, a thermosetting resin, a photo-curing resin, and the like. Of these, the thermoplastic resin is preferable. These can be used either alone or in combination of two or more. A plasticizer may be added into the resin, in order to adjust flexibility of the composite material for piezoelectric transduction.

Specific examples of the resins include poly vinyl chloride, chlorinated poly propyrene, poly vinylidene chloride, poly vinyl acetate, poly vinyl alcohol, poly vinyl fluoride, poly vinylidene fluoride, poly acrylonitrile, poly methylmethacrylate, styrene acrylonitrile copolymer, acrylonitrile butadiene styrene ternary polymer, vinyl chloride vinyl acetate copolymer, acryl vinyl chloride copolymer, ethylene vinyl chloride copolymer, ethylene vinyl alcohol copolymer, chlorinated vinyl chloride, and the like.

There is no particular limitation on the rubber, and can be suitably selected according to purposes. Examples of the rubber include natural rubber, synthetic rubber, and the like. These can be used either alone or in combination of two or more.

Specific examples of the rubber include natural rubber, modified natural rubber, grafted natural rubber, cyclized natural rubber, chlorinated natural rubber, styrene-butadiene rubber, chloroprene rubber, acrylonitrile-butadiene rubber, carboxylated nitrile rubber, nitrile rubber/chlorinated resin blend, nitrile rubber/EPDM rubber blend, butyl rubber, brominated butyl rubber, chlorinated butyl rubber, ethylene-vinyl acetate rubber, acrylic rubber, ethylene-acrylic rubber, chlorosulfonated polyethylene, chlorinated polyethylene, epichlorohydrin rubber, epichlorohydrin-ehtylene oxide rubber, methyl silicone rubber, vinyl-methyl silicone rubber, phenyl-methyl silicone rubber, fluorinated silicone rubber, and the like.

There is no particular limitation on the thermoplastic elastomer, and can be suitably selected according to purposes. Examples of the thermoplastic elastomer include polystyrene thermoplastic elastomer, poly vinyl chloride thermoplastic elastomer, polyolefin thermoplastic elastomer, polyurethane thermoplastic elastomer, polyester thermoplastic elastomer, polyamide thermoplastic elastomer, vinyl chloride thermoplastic elastomer, fluorinated rubber thermoplastic elastomer, polyethylene chloride thermoplastic elastomer, and the like. These can be used either alone or in combination of two or more.

The matrix material preferably contains a conductive material, from a viewpoint that the conductive material effectively transmits the electric energy which is transduced from vibrational energy by the domain that exhibits piezoelectricity and is formed of the material for piezoelectric transduction.

There is no particular limitation on the conductive material, and can be suitably selected according to purposes. Suitable examples of the conductive material include conductive fine particles, conductive filler, and the like. These can be used either alone or in combination of two or more.

Examples of the conductive fine particles include metallic fine particles, semiconductive fine particles, carbon black, fullerene, carbon nanotube, and the like.

Examples of the metallic fine particles include fine particles of metal such as copper, iron, nickel, or the like, alloy, and the like.

Suitable examples of the semiconductive fine particles include metallic oxide such as silica, alumina, or the like.

There is no particular limitation on a content of the conductive material in the matrix material, and can be suitably selected according to purposes. The content of the conductive material is preferably 5% by mass to 50% by mass.

If the content lies out of the above range, electric energy may be transduced insufficiently.

The composite material for piezoelectric transduction of the present invention can be suitably used in various fields. It can be particularly preferably used as a damping material.

The matrix material in the composite material for piezoelectric transduction receives external vibrational energy as strain, the strain of the matrix material is received as strain by the material for piezoelectric transduction which is a component of a domain that exhibits piezoelectricity, is transformed into electricity, and is then dissipated as Joule heat. As a result, the composite material for piezoelectric transduction of the present invention is capable of efficiently absorbing external vibrational energy.

From a viewpoint of maximizing the damping properties, when used as a damping material, the composite material for piezoelectric transduction preferably satisfies a relation of:

$$R \approx 1/\omega C$$

wherein "$\omega$" expresses frequency of vibration that is desirably to be reduced, "C" expresses a capacitance of the domain that exhibits piezoelectricity, and "R" expresses a conductive resistance of the matrix material.

(Process for Manufacturing a Material for Piezoelectric Transduction)

An example of a preferred process for manufacturing the material for piezoelectric tranduction of the present invention is shown in FIGS. 6A through 6D. The process includes, for example, a step of forming a domain and a step of dispersing the domain. The process for manufacturing the material for piezoelectric transduction may further include other steps suitably selected, if necessary.

An example of the process for manufacturing the material for piezoelectric tranduction is shown in FIGS. 6A through 6D. As will be described later, "application and desiccation," "orientation," "film setting," and "splitting" in FIGS. 6A through 6D correspond to the step of forming a domain, and "dispersed in rubber matrix" corresponds to the step of dispersing the domain."

The step of forming a domain is to form a domain that exhibits piezoelectricity.

The step of forming a domain is carried out by cutting a mold of the material for piezoelectric transduction, so as to provide splits of the mold.

There is no particular limitation on a process for forming the mold, and can be suitably selected according to purposes. Examples of the process for forming the mold include coating, molding (including forming), and press forming the material for piezoelectric transduction.

There is no particular limitation on the process for coating the material for piezoelectric transduction, and can be suitably selected from the known coating methods. Examples of the process for coating include spin coating method, bar coating method, kneader coating method, curtain coating method, blade coating method, and the like. The material for piezoelectric transduction is preferably coated on a rubbed surface. There is no particular limitation on a process for forming the rubbed surface, and can be suitably selected according to purposes.

Upon coating the material for piezoelectric transduction, a solvent can be used. There is no particular limitation on the solvent, and can be suitably selected according to purposes. The solvent can be used either alone or in combination of two or more types.

A process for molding the material for piezoelectric transduction is not specifically limited, and can be selected appropriately from the known processes in accordance with the object. Examples of the molding (forming) process include compression molding, transfer molding, injection molding, powder molding, rotational molding, blow molding, injection blow molding, extrusion blow molding, extrusion molding, calender molding, thermoforming, pressure molding, flow molding, paste forming, vacuum molding, foam molding, lamination molding, and the like.

A process for press forming is not specifically limited, and can be selected appropriately from the known processes in accordance with the object.

A process for the orientation is not particularly limited, and can be selected in accordance with the object. Examples include poling treatment and the like.

The poling treatment is not specifically limited, and can be selected appropriately in accordance with the object. In one example, a formed body of a composite material for piezoelectric transduction is fixed on a hot plate, a tungsten needle is placed at an appropriately selected distance from the formed body, and an arbitrary voltage is applied to the tungsten needle in order to conduct the treatment. In this example, it is preferred to maintain the temperature of the formed body at or more than the softening point of the formed body.

The step of dispersing the domain is for dispersing the splits.

There is no particular limitation on a process for dispersing the splits in the matrix material, and can be suitably selected according to purposes. The process for dispersing the splits is preferably carried out by dissolving or dispersing the matrix material in the solvent, by dispersing the splits in the solvent, in which the matrix material is already dissolved or dispersed, and then by film-forming the dispersion in which the matrix material and the splits are dispersed. There is no particular limitation on a process for film-forming, and can be suitably selected according to purposes.

As described above, the composite material for piezoelectric transduction can be efficiently manufactured.

Figure 6A:
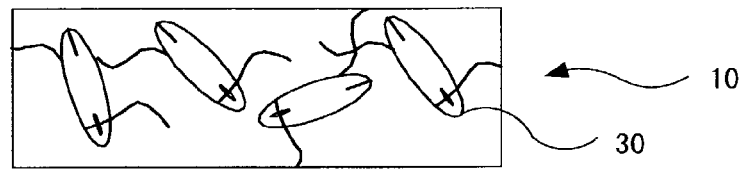
FIGS. 6A through 6D are each a schematic diagram showing an example of a process for manufacturing a film split of a composite material for piezoelectric transduction according to the present invention.
Figure 6B:
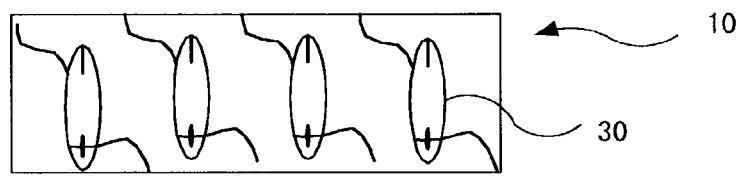
Figure 6C:
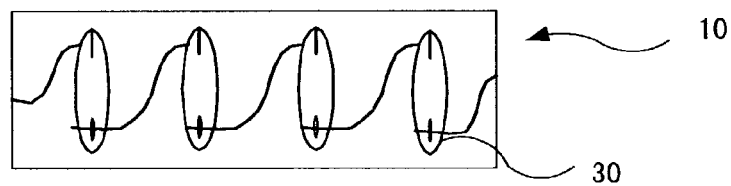
Figure 6D:
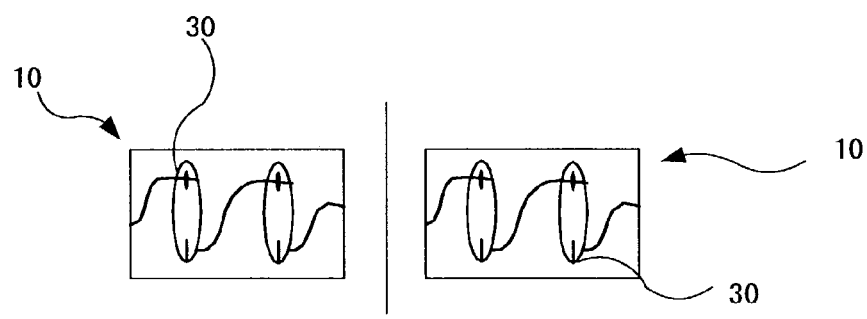

The step of forming the domain and the step of dispersing the domain will be described with reference to FIGS. 6A through 6D. The FIGS. 6A through 6D describe an example of a process for manufacturing the film split. FIG. 6A shows a film split 10 which has a plurality of main chain liquid crystal polymer 30. Referring into FIG. 6B, the plurality of main chain liquid crystal polymer 30 is aligned, and then the plurality of main chain liquid crystal polymer 30 is cured as shown in FIG. 6C. Thereafter, the film split 10 is chopped as shown in FIG. 6D. The film splits thus chopped are then dispersed in rubber matrix.

The EXAMPLEs and the COMPARATIVE EXAMPLEs of the present invention will be described hereinafter. However, the present invention is not limited to the following EXAMPLEs and the COMPARATIVE EXAMPLEs.

MANUFACTURE EXAMPLE 1

Manufacturing of Material for Piezoelectric Material

Synthesis of Main Chain Liquid Crystal Polymer 137 parts by mass of 4-acetoxy benzoic acid, 63 parts by mass of 6-acetoxy-2-naphthoic acid, and 0.01 part by mass of potassium acetate, were placed in a reaction container, were then raised in temperature to 150° C. while stirring, and were hence fully subjected to nitrogen-substitution. It was then further raised in temperature to 300° C. while stirring, and a pressure in the reaction container was gradually reduced while removing newly generating acetic acid. It was stirred in the above state for 1 hour. Thus, a main chain liquid crystal polymer A expressed by the following Formula (1) was synthesized.

A small amount of the main chain liquid crystal polymer A was provided between two plates of glass. Temperature at which softening began was observed using a polarization miroscope with heating, and was found out to be about 310° C.

The ratio of m to n in the following Formula (1) was m:n=73:27.

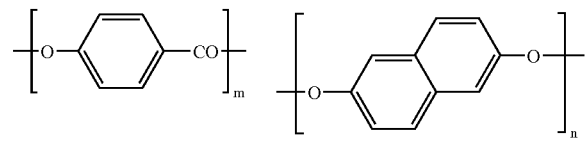

Formula (1)

Poling Treatment

The main chain liquid crystal polymer A was pressed to a thickness of around 200 μm, so as to prepare a sample sheet A. The sample sheet A was fixed on a hot plate. Tungsten needle was placed 1.5 cm above the upper surface of the sample sheet A, and voltage of 9.5 kV was applied to the tungsten needle, so as to provide a corona poling treatment. Thus, a sheet-shaped material for piezoelectric transduction A was made. During the corona poling treatment, the temperature of the sample sheet A was maintained at 320° C.

Piezoelectricity $\alpha$ of the material for piezoelectric transduction A at room temperature prior to heating was measured by a d33 meter, and was found out to be 5.8 pC/N. Piezoelectricity $\beta$ of the material for piezoelectric transduction A was measured at room temperature in the same manner after being heated for 7 days at 85° C. The piezoelectricity $\beta$ was 5.8 pC/N. According to the measurements of $\alpha$ and $\beta$, a decay rate (piezoelectricity $\alpha$−piezoelectricity $\beta$)/piezoelectricity $\alpha$) of the material for piezoelectric transduction A was calculated. The decay rate was 0.

MANUFACTURE EXAMPLE 2

Manufacturing of Material for Piezoelectric Material

Synthesis of Main Chain Liquid Crystal Polymer 137 parts by mass of 4-acetoxy benzoic acid, 63 parts by mass of 6-acetoxy-2-naphthoic acid, and 0.01 part by mass of potassium acetate, were placed in a reaction container, were then raised in temperature to 150° C. while stirring, and were hence fully subjected to nitrogen-substitution. It was then further raised in temperature to 250° C. while stirring, and a pressure in the reaction container was gradually reduced while removing newly generating acetic acid. It was stirred in the above state for 3 hours. Thus, a main chain liquid crystal polymer B expressed by the following Formula (1) was synthesized.

A small amount of the main chain liquid crystal polymer B was provided between two plates of glass. Temperature at which softening began was observed using a polarization miroscope with heating, and was found out to be 240° C.

The ratio of m to n in the following Formula (1) was m:n=73:27.

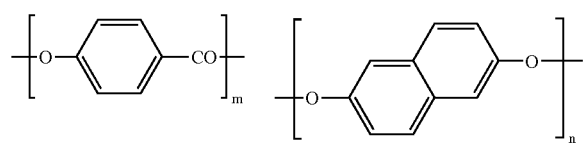

Formula (1)

In the same manner as MANUFACTURE EXAMPLE 1, the main chain liquid crystal polymer B was used to prepare a sample sheet B (thickness of about 200 μm). The corona poling treatment was conducted on the sample sheet B, and a sheet-shaped material for piezoelectric transduction B was made. During the corona poling treatment, the temperature of the sample sheet B was maintained at 260° C.

Piezoelectricity values of the material for piezoelectric transduction B was measured in the same manner as in MANUFACTURE EXAMPLE 1. The piezoelectricity $\alpha$ was 1.2 pC/N, and piezoelectricity $\beta$ was 1.1 pC/N. According to the measurements of $\alpha$ and $\beta$, a decay rate (piezoelectricity $\alpha$−piezoelectricity $\beta$)/piezoelectricity $\alpha$) of the material for piezoelectric transduction B was calculated. The decay rate was 0.08.

MANUFACTURE EXAMPLE 3

Manufacturing of Material for Piezoelectric Material

Synthesis of Main Chain Liquid Crystal Polymer 137 parts by mass of 4-acetoxy benzoic acid, 63 parts by mass of 6-acetoxy-2-naphthoic acid, and 0.01 part by mass of potassium acetate, were placed in a reaction container, were then raised in temperature to 150° C. while stirring, and were hence fully subjected to nitrogen-substitution. It was then further raised in temperature to 280° C. while stirring, and a pressure in the reaction container was gradually reduced while removing newly generating acetic acid. It was stirred in the above state for 1.5 hours. Thus, a main chain liquid crystal polymer C expressed by the following Formula (1) was synthesized.

A small amount of the main chain liquid crystal polymer C was provided between two plates of glass. Temperature at which softening began was observed using a polarization miroscope with heating, and was found out to be 270° C.

The ratio of m to n in the following Formula (1) was m:n=73:27.

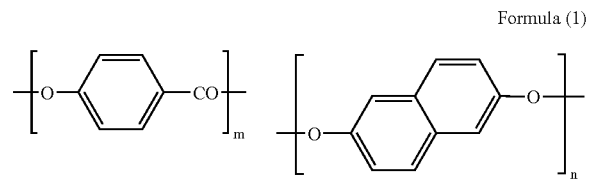

Formula (1)

In the same manner as MANUFACTURE EXAMPLE 1, the main chain liquid crystal polymer C was used to prepare a sample sheet C (thickness of about 200 μm). The corona poling treatment was conducted on the sample sheet C, and a sheet-shaped material for piezoelectric transduction C was made. During the corona poling treatment, the temperature of the sample sheet C was maintained at 280° C.

Piezoelectricity values of the material for piezoelectric transduction C was measured in the same manner as in MANUFACTURE EXAMPLE 1. The piezoelectricity α was 7.4 pC/N, and piezoelectricity β was 7.2 pC/N. According to the measurements of α and β, a decay rate (piezoelectricity α−piezoelectricity β)/piezoelectricity α) of the material for piezoelectric transduction C was calculated. The decay rate was 0.03.

MANUFACTURE EXAMPLE 4

Manufacturing of Material for Piezoelectric Material

Synthesis of Main Chain Liquid Crystal Polymer 137 parts by mass of 4-acetoxy benzoic acid, 63 parts by mass of 6-acetoxy-2-naphthoic acid, and 0.01 part by mass of potassium acetate, were placed in a reaction container, were then raised in temperature to 150° C. while stirring, and were hence fully subjected to nitrogen-substitution. It was then further raised in temperature to 290° C. while stirring, and a pressure in the reaction container was gradually reduced while removing newly generating acetic acid. It was stirred in the above state for 1 hour. Thus, a main chain liquid crystal polymer D expressed by the following Formula (1) was synthesized.

A small amount of the main chain liquid crystal polymer D was provided between two plates of glass. Temperature at which softening began was observed using a polarization miroscope with heating, and was found out to be 285° C.

The ratio of m to n in the following Formula (1) was m:n=73:27.

Formula (1)

In the same manner as MANUFACTURE EXAMPLE 1, the main chain liquid crystal polymer D was used to prepare a sample sheet D (thickness of about 200 μm). The corona poling treatment was conducted on the sample sheet D, and a sheet-shaped material for piezoelectric transduction D was made. During the corona poling treatment, the temperature of the sample sheet D was maintained at 295° C.

Piezoelectricity values of the material for piezoelectric transduction D was measured in the same manner as in MANUFACTURE EXAMPLE 1. The piezoelectricity α was 9.5 pC/N, and piezoelectricity β was 9.4 pC/N. According to the measurements of α and β, a decay rate ((piezoelectricity α−piezoelectricity β)/piezoelectricity α) of the material for piezoelectric transduction D was calculated. The decay rate was 0.01.

EXAMPLE 1

An aromatic liquid crystal polymer fiber (Vectran (registered Trademark): available from KURARAY Co., Ltd.) was cut in a length of 5 mm on average so as to form the thread splits of the domain that exhibits piezoelectricity expressed by the following Formula (1). The thread splits thus obtained was used as the domain. 50 parts by mass of carbon black (SEAST 3HAF: available from Tokai Carbon Co., Ltd.), 1 part by mass of stearic acid, 1 part by mass of lubricant (GREG G8205: available from DAINIPPON INK AND CHEMICALS INCORPORATED), 2 parts by mass of antioxidant (NOCRAC White: available from OUCHI SHINKO CHEMICAL INDUSTRIAL Co., Ltd.), and 1.5 parts by mass of curing agent (VULNOC AB: available from OUCHI SHINKO CHEMICAL INDUSTRIAL Co., Ltd.) were added to 100 parts by mass of acrylic rubber (Nipol AR31: available from ZEON CORPORATION) was then mixed for 8 hours at 170° C., so as to prepare the matrix material. The matrix material and the thread splits were mixed and press formed so as to obtain a sheet-shaped composite material for piezoelectric transduction (1). A content of the thread splits in the composite material for piezoelectric transduction (1) was 13% by mass.

An evaluation of the loss factor and decay rate of the sheet-shaped composite material for piezoelectric transduction (1), which was thus obtained, was conducted as described hereafter.

Formula (1)

approx. m:n = 73:27

<Measurement of Loss Factor>

Figure 7A:
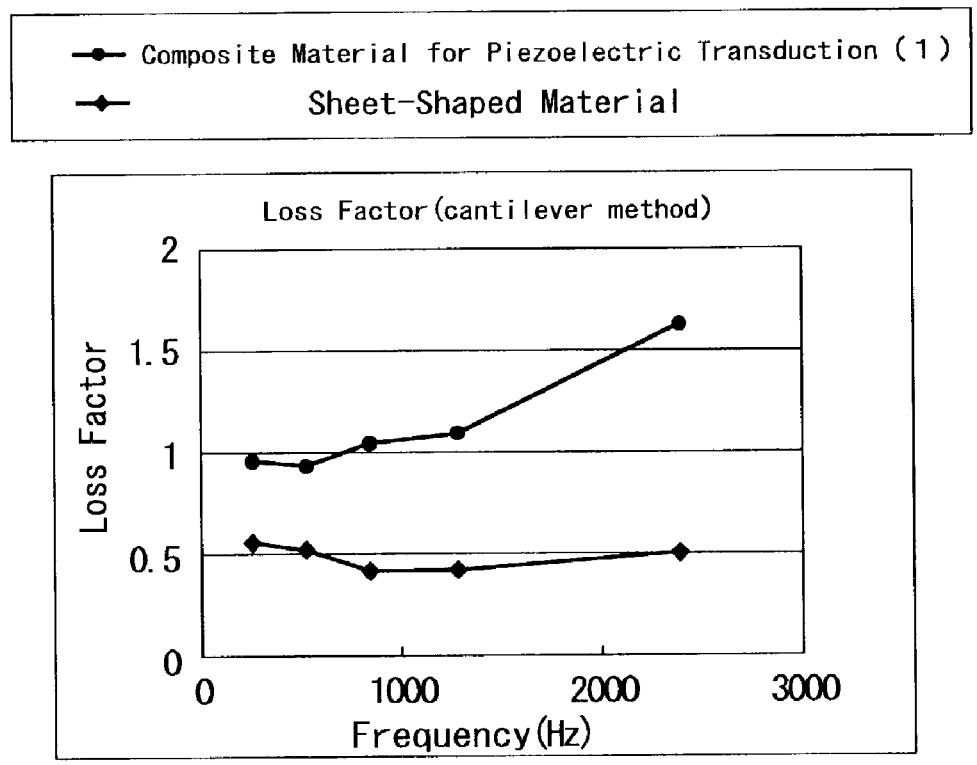
FIGS. 7A and 7B are each a graph showing a relationship between a resonance frequency (Hz) and a loss factor, each of which is measured by cantilever method and by central excitation method.
Figure 7B:
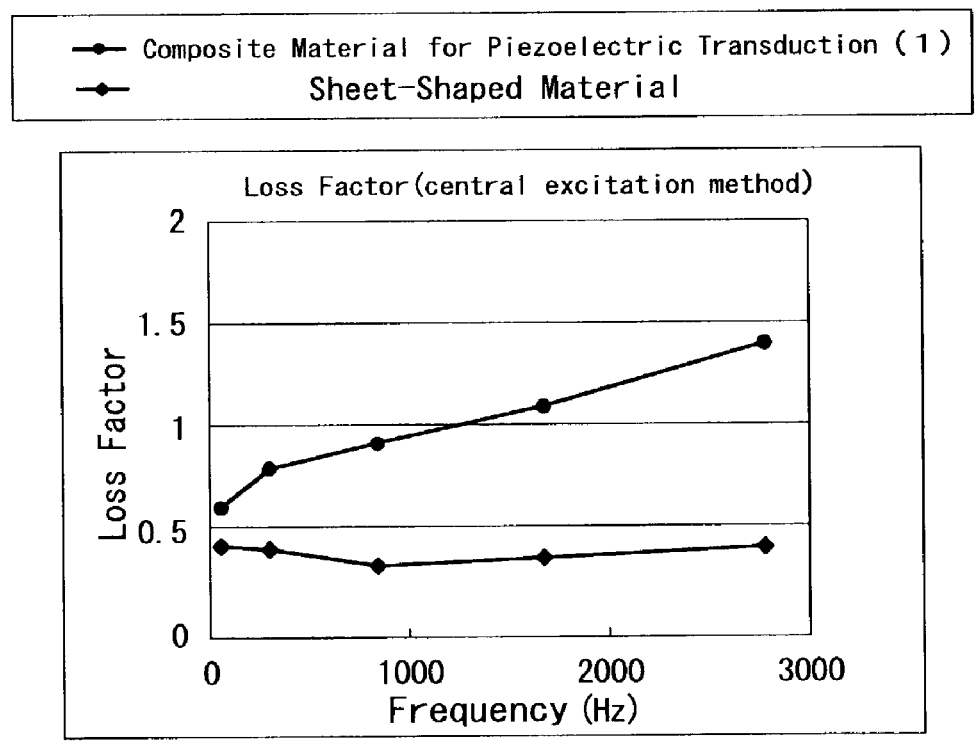

The sheet-shaped composite material for piezoelectric transduction (1) thus obtained was subjected to observing a relationship between a resonance frequency (Hz) and a loss factor, based on the cantilever method specified by JIS G0602. The result is shown in FIG. 7A. The sheet was also subjected to observing a relationship between an antiresonant frequency (Hz) and a loss factor, based on the central excitation method specified by JIS G0602. The result is shown in FIG. 7B.

EXAMPLE 2

Figure 8A:
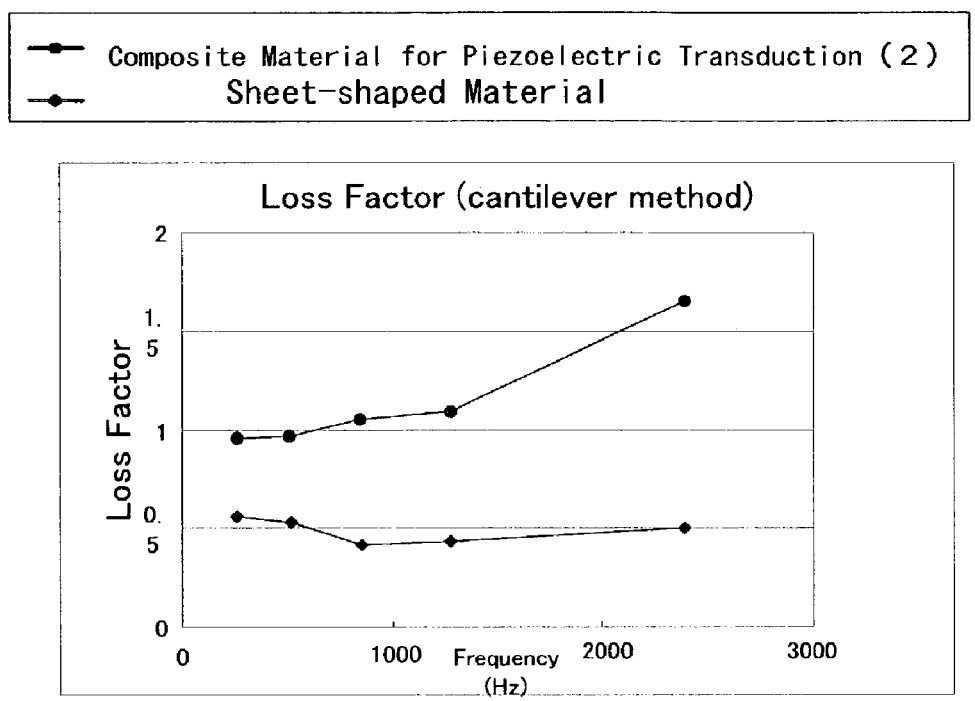
FIGS. 8A and 8B are each a graph showing a relationship between a resonance frequency (Hz) and a loss factor, each of which is measured by cantilever method and by central excitation method.
Figure 8B:
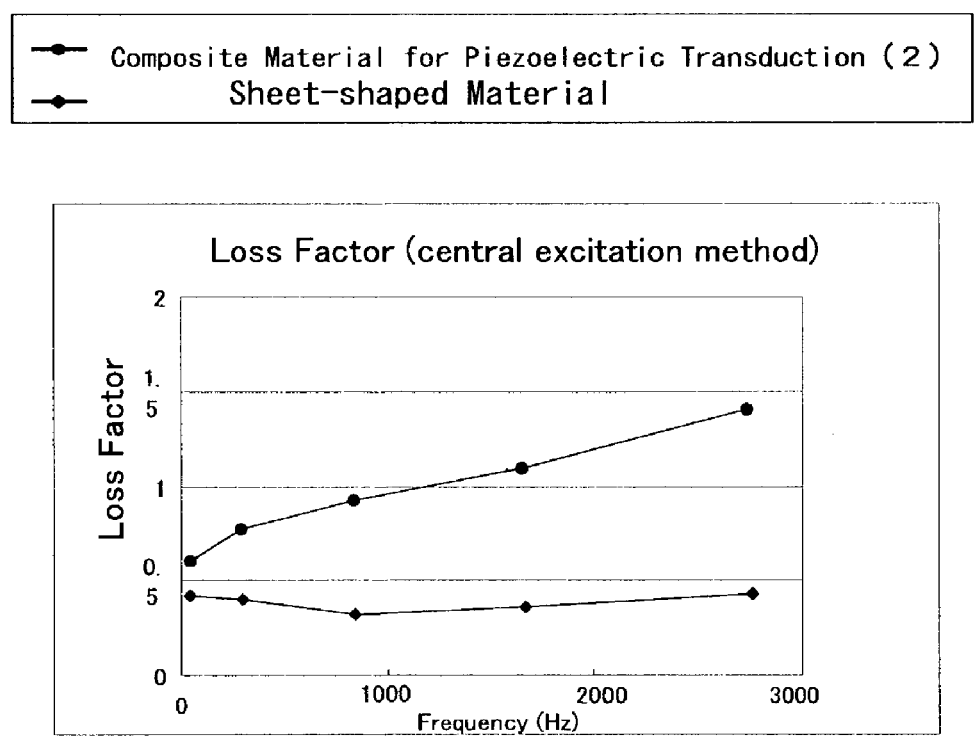

A sheet-shaped composite material for piezoelectric transduction (2) was made in the same manner as in EXAMPLE 1, except that the aromatic liquid crystal polymer fiber (Vectran (registered Trademark): available from KURARAY Co., Ltd.) was replaced with the material for piezoelectric transduction A (cut and split into thread splits of 5 mm in length in average). The sheet-shaped composite material for piezoelectric transduction (2) thus obtained was subjected to observing a relationship between a resonance frequency (Hz) and a loss factor, based on the cantilever method. The result is shown in FIG. 8A. The sheet was also subjected to observing a relationship between an antiresonant frequency (Hz) and a loss factor, based on the central excitation method. The result is shown in FIG. 8B.

EXAMPLE 3

Figure 9A:
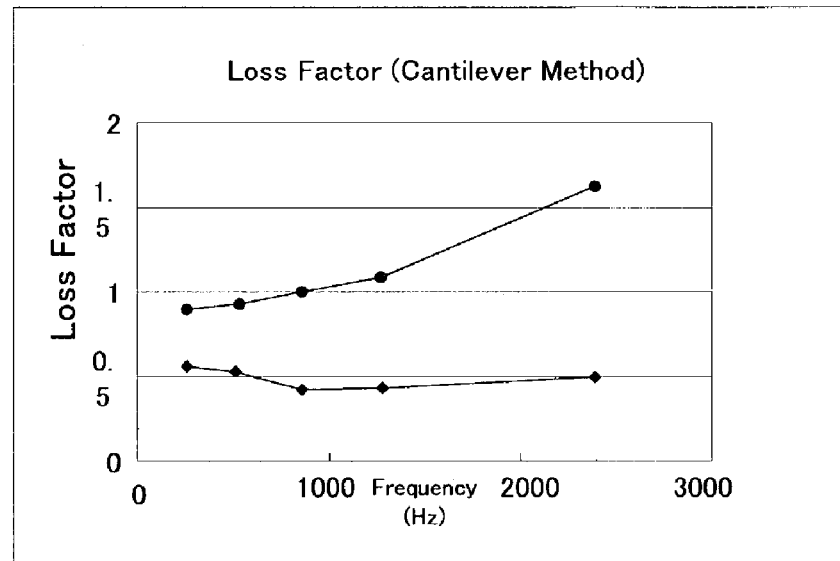
FIGS. 9A and 9B are each a graph showing a relationship between a resonance frequency (Hz) and a loss factor, each of which is measured by cantilever method and by central excitation method.
Figure 9B:
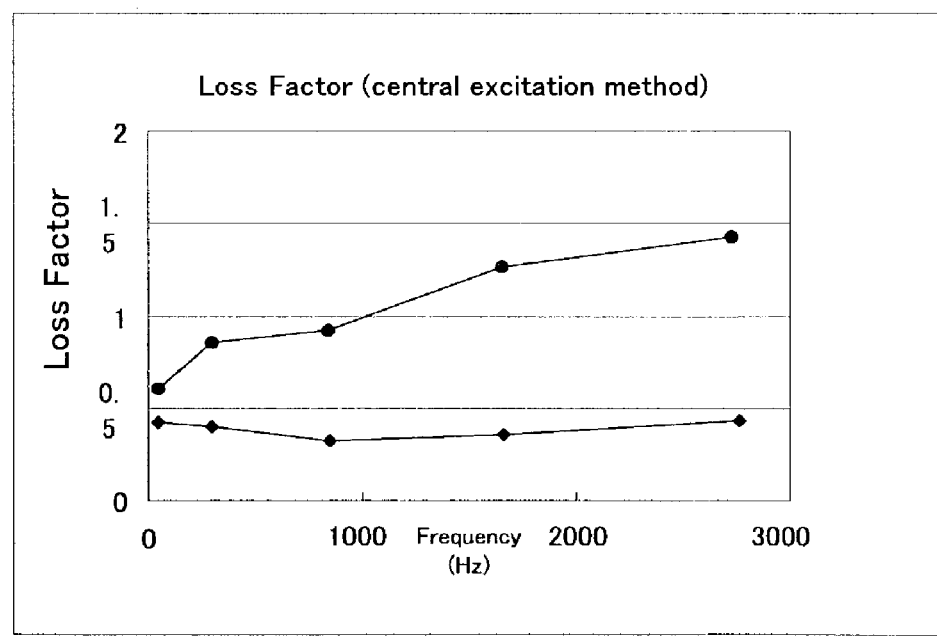

A sheet-shaped composite material for piezoelectric transduction (3) was made in the same manner as in EXAMPLE 1, except that the aromatic liquid crystal polymer fiber (Vectran (registered Trademark): available from KURARAY Co., Ltd.) was replaced with the material for piezoelectric transduction B (cut and split into thread splits of 5 mm in length in average). The sheet-shaped composite material for piezoelectric transduction (3) thus obtained was subjected to observing a relationship between a resonance frequency (Hz) and a loss factor, based on the cantilever method. The result is shown in FIG. 9A. The sheet was also subjected to observing a relationship between an antiresonant frequency (Hz) and a loss factor, based on the central excitation method. The result is shown in FIG. 9B.

EXAMPLE 4

Figure 10A:
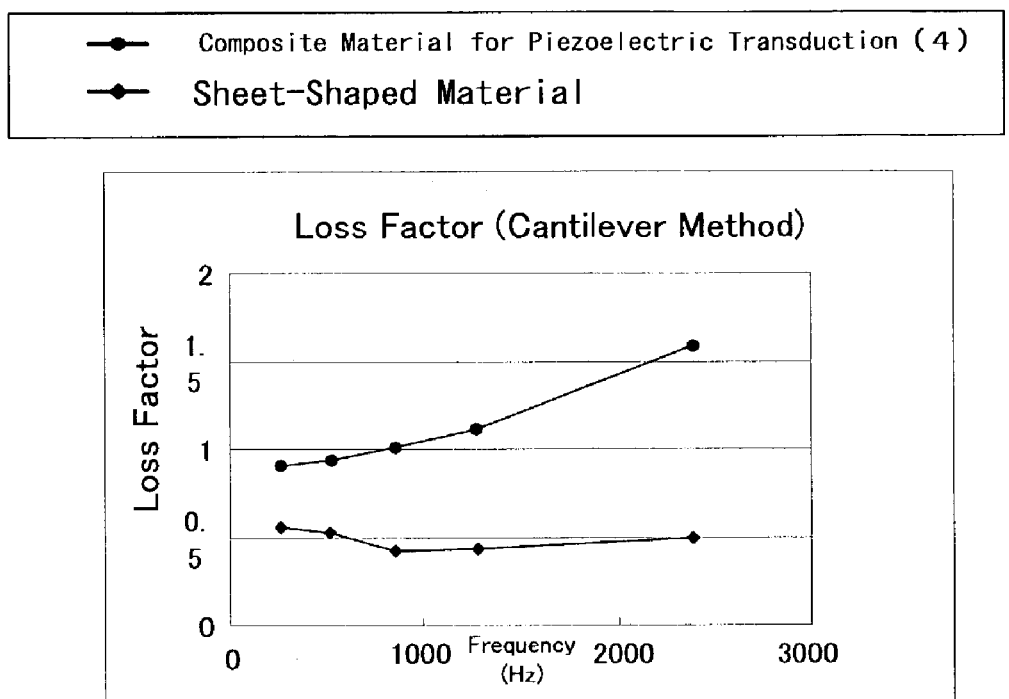
FIGS. 10A and 10B are each a graph showing a relationship between a resonance frequency (Hz) and a loss factor, each of which is measured by cantilever method and by central excitation method.
Figure 10B:
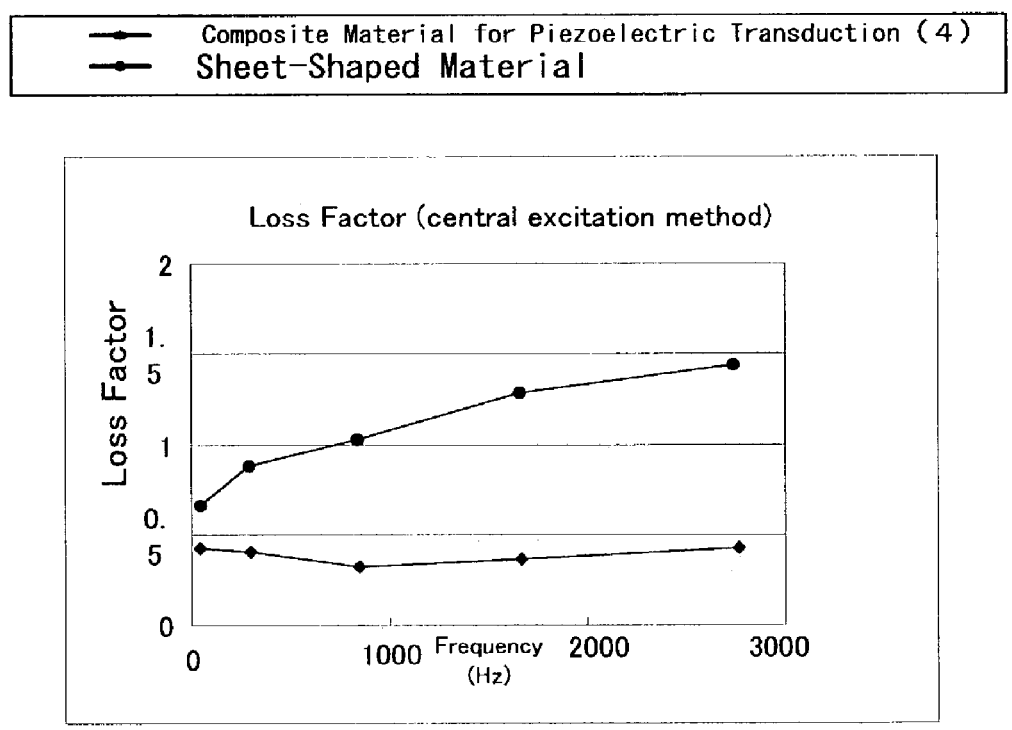

A sheet-shaped composite material for piezoelectric transduction (4) was made in the same manner as EXAMPLE 5, except that the aromatic liquid crystal polymer fiber (Vectran (registered Trademark): available from KURARAY Co., Ltd.) was replaced with the material for piezoelectric transduction C (cut and split into thread splits of 5 mm in length in average). The sheet-shaped composite material for piezoelectric transduction (4) thus obtained was subjected to observing a relationship between a resonance frequency (Hz) and a loss factor, based on the cantilever method. The result is shown in FIG. 10A. The sheet was also subjected to observing a relationship between an antiresonant frequency (Hz) and a loss factor, based on the central excitation method. The result is shown in FIG. 10B.

EXAMPLE 5

Figure 11A:
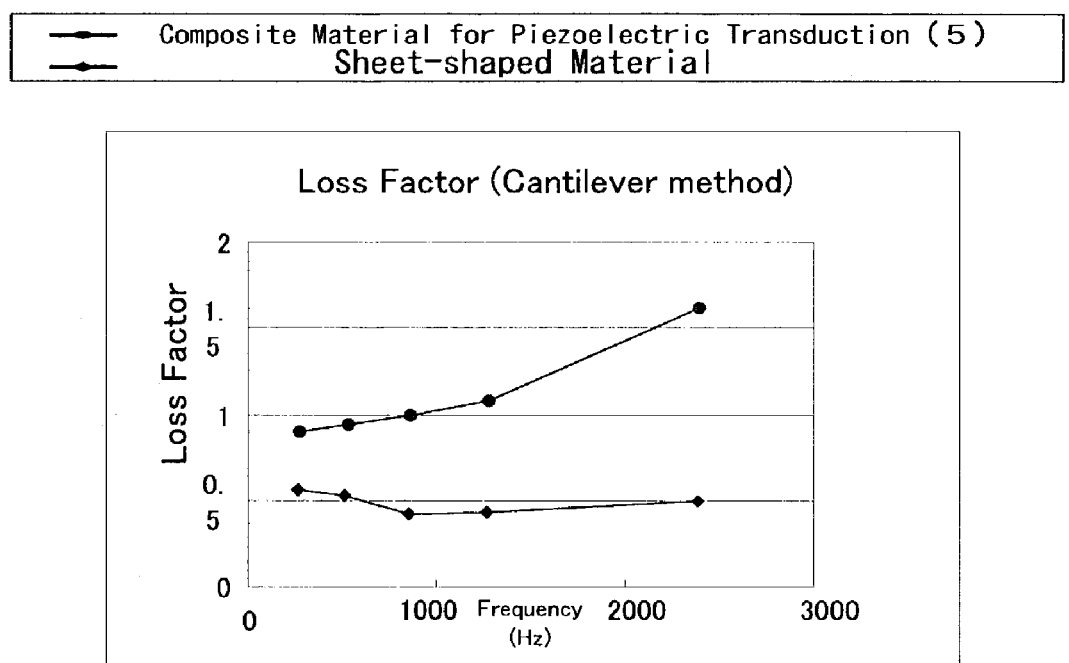
FIGS. 11A and 11B are each a graph showing a relationship between a resonance frequency (Hz) and a loss factor, each of which is measured by cantilever method and by central excitation method.
Figure 11B:
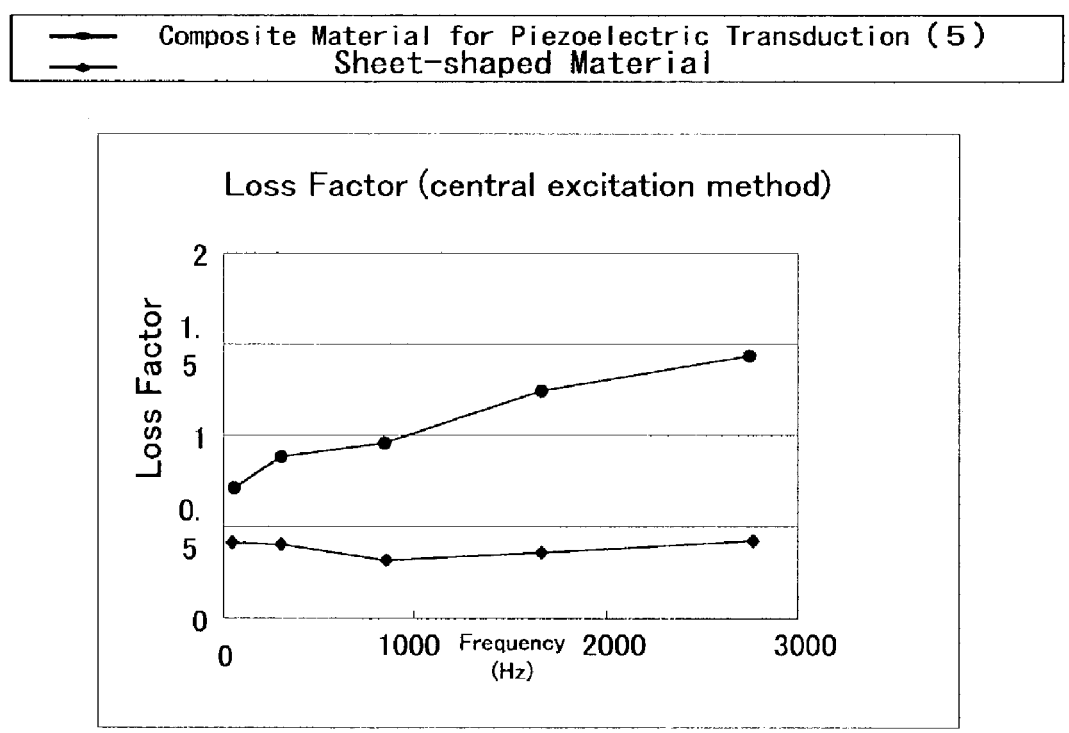

A sheet-shaped composite material for piezoelectric transduction (5) was made in the same manner as in EXAMPLE 1, except that the aromatic liquid crystal polymer fiber (Vectran (registered Trademark): available from KURARAY Co., Ltd.) was replaced with the material for piezoelectric transduction D (cut and split into thread splits of 5 mm in length in average). The sheet-shaped composite material for piezoelectric transduction (5) thus obtained was subjected to observing a relationship between a resonance frequency (Hz) and a loss factor, based on the cantilever method. The result is shown in FIG. 11A. The sheet was also subjected to observing a relationship between an antiresonant frequency (Hz) and a loss factor, based on the central excitation method. The result is shown in FIG. 11B.

Comparative Example 1

A sheet-shaped material was obtained in the same way as in EXAMPLE 1, except that the thread splits were not used. The loss factor of the sheet-shaped material of COMPARATIVE EXAMPLE 1 was measured. The results are shown in FIGS. 7A through 11B.

As shown in FIGS. 7A through 11B, it was clearly found out that the sheet-shaped composite materials for piezoelectric transduction of EXAMPLEs 1 to 5 function as a damping material. Additionally, it was found out that these composite materials for piezoelectric transduction maintain stable piezoelectricity even if being kept at high temperature for a long period.

The present invention solves various problems in the related art, and provides a composite material for piezoelectric transduction which can be suitably utilized in various fields as a damping material or the like, maintains sufficient piezoelectric properties when stored even at high temperature for a long period, and can be suitably utilized in the fields that require heat-resistance. The composite material for piezoelectric transduction of the present invention absorbs external vibration or the like as strain energy, efficiently transforms the strain energy into electricity, and is capable of dissipating the electricity as heat, by using a material for piezoelectric transduction which is excellent in mass production at low cost and handlings.

What is claimed is:

1. A composite material for piezoelectric transduction comprising:
    a matrix material; and
    a domain which exhibits piezoelectricity and is disposed in the matrix material,
    wherein the domain is formed of a material for piezoelectric transduction which contains a main chain liquid crystal polymer,
    wherein the domain is formed of splits, each of which is formed by cutting a mold of the material for piezoelectric transduction, and
    wherein the directions of dielectric polarization of the splits are the same.

2. A composite material for piezoelectric transduction according to claim 1, wherein the main chain liquid crystal polymer comprises a constitutional unit having a cyclic group, as a repeated unit.

3. A composite material for piezoelectric transduction according to claim 1, wherein the main chain liquid crystal polymer is at least one selected from polyesters.

4. A composite material for piezoelectric transduction according to claim 1, wherein the main chain liquid crystal polymer is at least one selected from aromatic polymers.

5. A composite material for piezoelectric transduction according to claim 4, wherein the aromatic polymer is at least one selected from aromatic polyesters.

6. A composite material for piezoelectric transduction according to claim 5, wherein the aromatic polyester has at least one selected from aromatic diol, aromatic dicarboxylic acid, and aromatic hydroxycarboxylic acid, as a monomer unit for the aromatic polyester.

7. A composite material for piezoelectric transduction according to claim 4, wherein the aromatic polymer comprises a structure expressed by the following Formula (1):

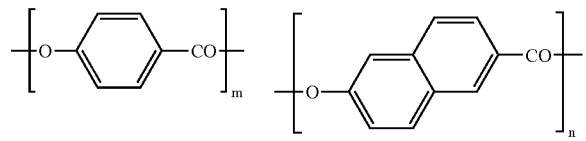

Formula (1)

wherein "m" and "n" each express a degree of polymerization.

8. A composite material for piezoelectric transduction according to claim 1, wherein the main chain liquid crystal polymer has a maximum polarizability in a direction substantially parallel to a main chain thereof.

9. A composite material for piezoelectric transduction according to claim 1, wherein the material for piezoelectric transduction further comprises a binder resin.

10. A composite material for piezoelectric transduction according to claim 1, wherein the splits are at least one selected from thread splits, film splits, and granular splits.

11. A composite material for piezoelectric transduction according to claim 1, wherein the splits are thread splits, and each of the thread splits has the same diameter, and a length, and is formed of the same material.

12. A composite material for piezoelectric transduction according to claim 1, wherein the splits are thread splits, and at least one of a diameter, a length, and a material, is different from each of the thread splits.

13. A composite material for piezoelectric transduction according to claim 1, wherein the splits are film splits, and each of the film splits has the same area, and a thickness, and is formed of the same material.

14. A composite material for piezoelectric transduction according to claim 1, wherein the splits are film splits, and at least one of an area, a thickness, and a material, is different for each of the film splits.

15. A composite material for piezoelectric transduction according to claim 1, wherein the splits and the matrix have the same elastic moduli.

16. A composite material for piezoelectric transduction according to claim 1, wherein the matrix material contains a conductive material.

17. A composite material for piezoelectric transduction according to claim 16, wherein the conductive material is selected from conductive fine particles and conductive filler.

18. A composite material for piezoelectric transduction according to claim 17, wherein the conductive fine particles are selected from metallic fine particles, semiconductive fine particles, carbon black, fullerene, and carbon nanotube.

19. A composite material for piezoelectric transduction according to claim 1, wherein the matrix material is selected from a resin, rubber, and a thermoplastic elastomer.

20. A composite material for piezoelectric transduction according to claim 1, wherein a decay rate of the domain is 0.1 or less, and the decay rate is defined as:

$$((\text{piezoelectricity } \alpha - \text{piezoelectricity } \beta)/\text{piezoelectricity } \alpha),$$

wherein "$\alpha$" expresses a piezoelectricity of the domain at room temperature prior to heating and "$\beta$" expresses a piezoelectricity of the domain at room temperature after seven days of continuous heating at 85° C.

21. A composite material for piezoelectric transduction according to claim 1, wherein the composite material for piezoelectric transduction is a damping material.

22. A composite material for piezoelectric transduction according to claim 21, wherein the composite material for piezoelectric transduction satisfies a relation of:

$$R \approx 1/\omega C$$

wherein "$\omega$" expresses frequency of vibration that is desirably to be reduced, "$C$" expresses a capacitance of the domain that exhibits piezoelectricity, and "$R$" expresses a conductive resistance of the matrix material.

* * * * *

UNITED STATES PATENT AND TRADEMARK OFFICE
CERTIFICATE OF CORRECTION

| | |
|---|---|
| PATENT NO. | : 7,029,598 B2 |
| APPLICATION NO. | : 10/463809 |
| DATED | : April 18, 2006 |
| INVENTOR(S) | : Masao Sato |

It is certified that error appears in the above-identified patent and that said Letters Patent is hereby corrected as shown below:

On the Cover Page:
In item (73) change "Fuji Photo Film Co., Ltd., Minamo –Ashigara (JP)" to be
-- Fuji Photo Film Co., Ltd., Kanagawa (JP) --

Signed and Sealed this

Nineteenth Day of December, 2006

JON W. DUDAS
*Director of the United States Patent and Trademark Office*